United States Patent [19]

Shinkawa et al.

[11] 4,211,977
[45] Jul. 8, 1980

[54] MIXER CIRCUIT ARRANGEMENT

[75] Inventors: Keiro Shinkawa; Hiroji Shoyama; Chuichi Sodeyama, all of Yokohama, Japan

[73] Assignee: Hitachi, Ltd., Japan

[21] Appl. No.: 768,730

[22] Filed: Feb. 15, 1977

[30] Foreign Application Priority Data

Feb. 16, 1976 [JP] Japan .................................. 51-14872
Feb. 16, 1976 [JP] Japan .................................. 51-14873
Feb. 16, 1976 [JP] Japan .................................. 51-14874
Feb. 16, 1976 [JP] Japan .................................. 51-14875
Feb. 16, 1976 [JP] Japan .................................. 51-14876

[51] Int. Cl.² .......................................... H04B 1/26
[52] U.S. Cl. ..................................... 455/326; 333/176
[58] Field of Search ............... 325/446, 445, 449, 442, 325/437, 436, 439, 448, 451; 333/176, 175, 227, 248, 239, 84 M, 73 S, 73 C, 97 R, 84 R; 321/69 R, 69 W, 69 NL; 331/77, 42, 43, 107 P

[56] References Cited

U.S. PATENT DOCUMENTS

| 3,479,601 | 11/1969 | Mattern | 325/446 |
| 3,652,940 | 3/1972 | Reiter et al. | 325/446 |
| 3,890,573 | 6/1975 | Strenglein | 325/445 |
| 3,916,315 | 10/1975 | Konishi | 325/445 |
| 3,943,450 | 3/1976 | Otremba | 325/446 |

Primary Examiner—Benedict V. Safourek
Assistant Examiner—Tommy P. Chin
Attorney, Agent, or Firm—Craig & Antonelli

[57] ABSTRACT

A mixer circuit employing a distributed constant circuit using a strip line includes a strip line for applying a high frequency signal and a local oscillation signal to a diode. The strip line is provided with a filter for exclusively blocking the local oscillation signal and a filter for exclusively blocking the high frequency signal. The strip line further includes a line which acts as a shortcircuit for an intermediate frequency signal and as an open impedance for the high frequency signal and the local oscillation signal.

3 Claims, 8 Drawing Figures

MIXER CIRCUIT ARRANGEMENT

BACKGROUND OF THE INVENTION

1. FIELD OF THE INVENTION

The present invention relates to a mixer circuit arrangement used in a high frequency signal receiver, and more particularly to an improvement in the mixer circuit arrangement employing a distributed constant circuit using a strip line as a basic component thereof.

2. DESCRIPTION OF THE PRIOR ART

The mixer circuit used in the receiver comprises a frequency converting device such as a diode, a band pass filter for exclusively passing a high frequency signal to apply the same to the device, a band pass filter for exclusively passing a local oscillation signal to apply the same to the device, and a low pass filter for extracting from the device only an intermediate frequency signal of a frequency equal to the difference between the frequency of the high frequency signal and the local oscillation signal frequency. It is well known that a frequency converting device such as the diode produces, in addition to the intermediate frequency signal having a frequency equal to the frequency of the input high frequency signal and the local oscillation signal frequency, an image signal of a frequency equal to the difference between a harmonic having a frequency which is twice as high as the frequency of the local oscillation signal and the frequency of the input high frequency signal. The suppression of the occurrence of the image signal leads to the enhancement of the performance of the mixer circuit. To this end, it is necessary to provide a sharp characteristic with the band pass filter for the input high frequency signal to sufficiently suppress the local oscillation signal, and further to provide a sharp characteristic with the band pass filter for the local oscillation signal to sufficiently suppress the input high frequency signal and the image signal. The characteristic of those band pass filters should be extremely sharp particularly when the intermediate frequency is very low relative to the frequency of the input high frequency signal. Such sharp characteristics can be attained relatively easily when a microwave circuit using a wave guide as a band pass filter is employed.

On the other hand, a distributed constant circuit using a microwave strip line which is simple in circuit arrangement and which can be constructed in a small size has been known. When such a microwave strip line is used in the mixer circuit for an SHF band signal receiver, the circuit construction can be readily constructed in a small size. However, in this case, the frequency selectivity characteristics of the two band pass filters described above must be very sharp because the intermediate frequency for the SHF band is low.

SUMMARY OF THE INVENTION

It is an object of the present invention to provide a novel mixer circuit arrangement employing a distributed constant circuit using a microwave strip line.

It is another object of the present invention to provide a mixer circuit arrangement which is simple in structure and can be constructed in a small size.

It is a further object of the present invention provide a mixer circuit arrangement having a low insertion loss.

To accomplish the above objects, the present invention is characterized by the insertion of a band eliminating filter for blocking undesired signals in an input line of a high frequency signal and a local oscillation signal to be supplied to a frequency converting diode, instead of using a multi-stage band pass filter.

DESCRIPTION OF THE PREFERRED EMBODIMENTS

Figure 1:
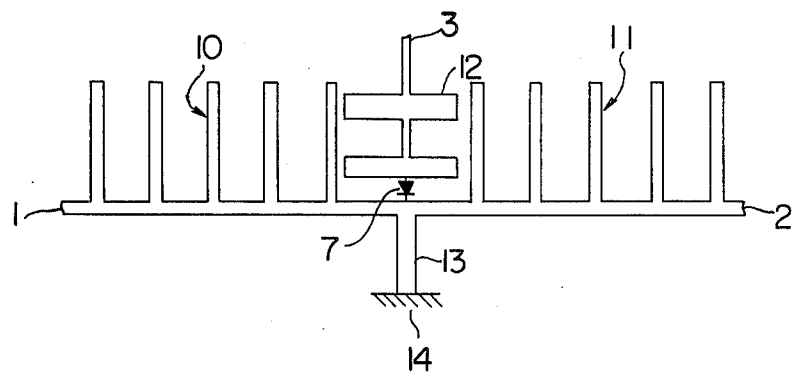
FIG. 1 shows a pattern of a microwave strip line illustrating an example of a construction o a prior art mixer circuit.

FIG. 1 shows an example of a prior art mixer circuit using a microwave strip line. It shows a pattern of the mixer circuit using the microwave strip line.

A high frequency signal applied to a terminal 1 is applied to a diode 7 through a band pass filter 10 comprising four parallel stages each having an open-ended stub of a length equal to one half of a wavelength of the high frequency signal and spaced one quarter of the wavelength from each other. On the other hand, a local oscillation siganl applied to a terminal 2 is applied to the diode 7 through a band pass filter 11 comprising four parallel stages each having an open-ended stub of a length equal to one half of a wavelength of the local oscillation signal and spaced one quarter of that wavelength from each other. The band pass filter 10 is located at a such position that it exhibits an open impedance for the local oscillation signal frequency as viewed from the junction point of the diode 7, and the band pass filter 11 is located at such a position that it exhibits an open impedance for the frequency of the high frequency signal as viewed from the junction point of the diode 7 so that the two input signals are applied to the diode 7 in an efficient manner. An intermediate frequency signal produced at the diode 7 is passed to an output terminal 3 through a two-stage low pass filter 12 which exhibits a shorted impedance to the two input signals and an image signal. In FIG. 1, a stub 13 terminated with a shorted block 14 exhibits an open impedance to the two input signals while it exhibits a shorted impedance to the intermediate frequency signal and at the same time functions as a conduction circuit for passing a diode current.

As seen from the above, in order to attain a sharp frequency selectivity characteristic in a distributed constant circuit having a low Q, a multi-stage filter arrangement is required. As a result, the overall size of the circuit arrangement increases and an insertion loss of the band pass filter considerably increases, resulting in poor performance of the mixer circuit. Furthermore, in the mixer circuit arrangement shown in FIG. 1, it is difficult to arrange the band pass filters 10 and 11 at such positions that they exhibit open impedances to opposing input signals, respectively, as viewed from the junction point of the diode 7.

Figure 2:
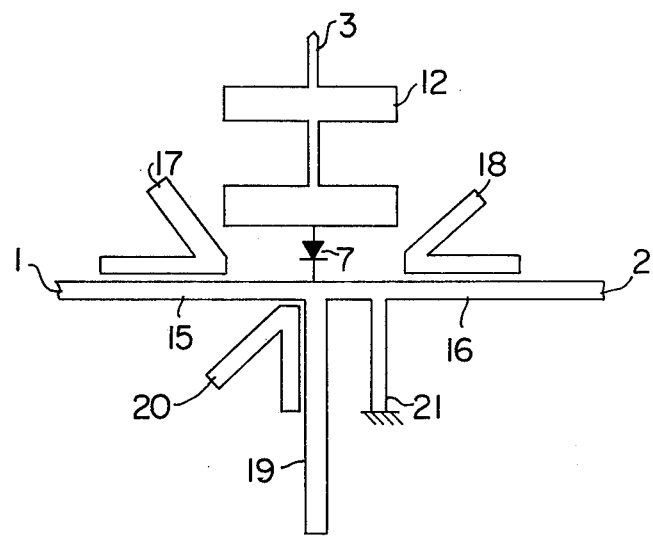
FIGS. 2 to 8 show patterns of microwave strip lines illustrating constructions of mixer circuits in accordance with the present invention.

FIG. 2 shows a pattern illustrating one embodiment of the present invention. Coupled to an input line 15 for a high frequency signal is a parallel-coupled band elimination filter 17 for blocking a local oscillation signal comprising an double-end-open line of a length equal to one half of the wavelength of the local oscillation frequency with the line acutely being bent at a point one quarter of the wavelength from one end thereof and with a portion thereof being arranged in parallel with the transmission line 15. The band elimination filter 17 is inserted such that the center of the one half wavelength line thereof is located at a point spaced approximately one quarter of the wavelength of the local oscillation signal frequency from the junction point of the diode 7. As a result, the impedance for the local oscillation signal frequency as viewed from the diode 7 into the high frequency signal input line 15 is substantially an open impedance. On the other hand, coupled to an input line 16 for the local oscillation signal is a parallel-coupled band elimination filter 18 for the high frequency signal, which is inserted at such a point that the impedance as viewed from the junction point of the diode 7 into the local oscillation signal input line 16 assumes an open impedance to the frequency of the high frequency signal. On the opposite side of the diode 7, an end-open line 19 of a length which is approximately equal to one half of the wavelength of the high frequency signal and the local oscillation signal is connected, and coupled to the line 19 is a parallel-coupled band elimination filter 20 for the image signal, which is inserted at such a point that the impedance to the image signal frequency as viewed from the diode 7 assumes a shorted impedance. Since the line 19 is an open-ended line having one half wavelength, the line 19 exhibits substantially an open impedance to the high frequency signal and the local oscillation signal as viewed from the diode 7. A shorting line 21 for an intermediate frequency signal is connected to the local oscillation signal input line 16 (or the high frequency signal input line 15).

With the arrangement described above, the high frequency signal received at the terminal 1 is applied to the diode 7 in an efficient manner since the local oscillation signal input line 16 exhibits an open impedance as viewed from the diode 7 because of the band elimination filter 18, and the local oscillation signal received at the terminal 2 is similarly applied to the diode 7 in an efficient manner. The image signal produced at the diode 7 is suppressed because the input thereof is shortcircuited by the band elimination filter 20 and the stage following the diode 7 is shortcircuited by a low pass filter 12. As a result, a large power intermediate frequency signal can be produced. The intermediate frequency signal produced at the diode 7 is transmitted to the output terminal 3 through the low pass filter 12 in an efficient manner because the input of the diode 7 is shortcircuited by the intermediate frequency shorting line 21. Since the mixer circuit described above suppresses the image signal produced at the diode by means of the shortcircuit, the efficiency of the generation of the intermediate frequency signal is enhanced and the conversion loss of the mixer is reduced. Furthermore, it offers the advantages of simplicity in construction, ease of adjustment and compact size.

Figure 3:
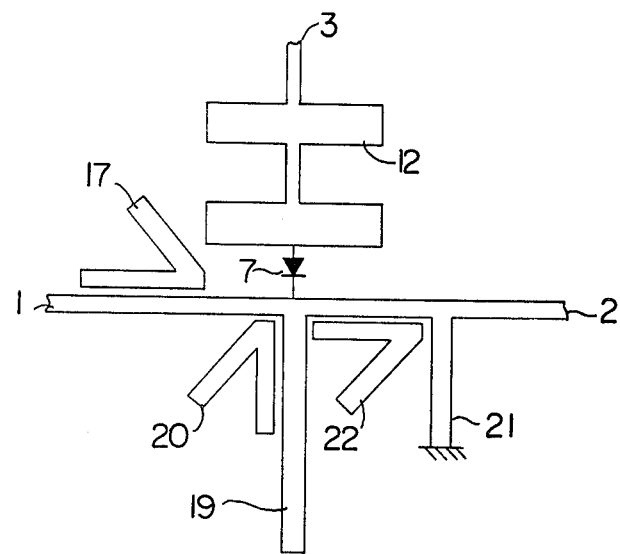

FIG. 3 shows a modification of the pattern shown in FIG. 2. Since it is sufficient that the high frequency signal band elimination filter 18 shown in FIG. 2 is coupled in such a manner that it exhibits an open impedance to the high frequency signal as viewed from the diode 7, the same effect is obtained in FIG. 3 where a high frequency signal band elimination filter 22 is coupled as illustrated. The same is true for the local oscillation signal band elimination filter 17 shown in FIG. 3.

In the present embodiment, a first parallel-coupled band elimination filter which resonates at the local oscillation signal frequency and a second parallel-coupled band elimination filter which resonates at the frequency of the high frequency signal are coupled to the high frequency signal input line and the local oscillation signal input line, respectively, of the mixer circuit such that the impedance as viewed from the junction point of the diode assumes an open impedance at the respective resonance frequencies of the first and second band elimination filters. On the opposite side of the diode at the junction point of the diode, an open-ended line of a length approximately equal to one half of the wavelength of the high frequency signal and the local oscillation signal is connected, and coupled to this line is a third parallel-coupled band elimination filter which resonates at the frequency of the image signal in such a manner that an impedance as viewed from the diode assumes a shorted impedance to the image signal frequency. Furthermore, an intermediate frequency signal shorting line is coupled to the high frequency signal input line or the local oscillation signal input line. The intermediate frequency signal is taken from the stage following the diode. Thus, since a multi-stage band pass filter is not used in the input stage, the insertion loss of the input circuit is low. Furthermore, since the image signal is suppressed by the shortcircuit, the loss of the mixer is reduced and the circuit construction is simplified, resulting in ease of adjustment and compact size.

Figure 4:
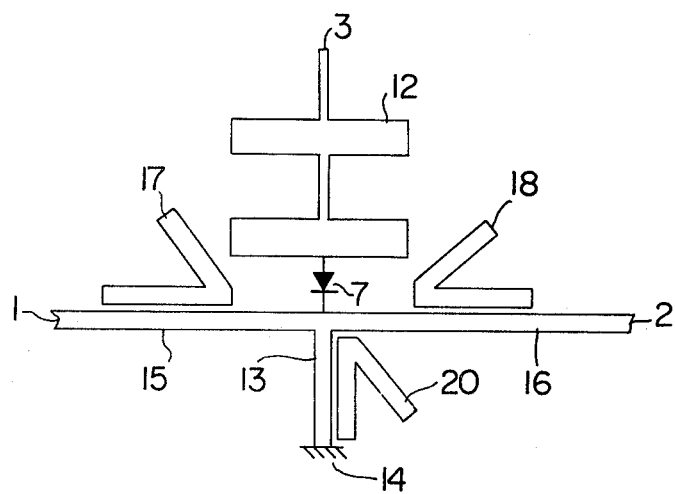

FIG. 4 shows a pattern of another embodiment of the present invention. It differs from the embodiments shown in FIGS. 2 and 3 in that connected on the opposite side of the diode 7 is an intermediate frequency signal shorting line 13 which exhibits a substantially open impedance to the high frequency signal and the local oscillation signal and a substantially shorted impedance to the intermediate frequency signal, that is, a short ended line of a length substantially equal to one quarter of the wavelength of the high frequency signal and the local oscillation signal. The line 13 is coupled such that the image signal band elimination filter 20 exhibits a shorted impedance to the image signal as viewed from the diode 7, The band elimination filter 20 has the same construction as the parallel-coupled band elimination filter 20 shown in FIGS. 2 and 3. Like the band elimination filters 17 and 18 for blocking the R-F signal and the local oscillation signal, respectively, the band elimination filter 20 has an open-ended line having a length corresponding to ½ the wavelength of the frequency of the signal to be blocked, which line has its ¼ wavelength portion arranged in parallel to and close to the line to which it is coupled and the remaining ¼ wavelength portion is bent away from that line. As is well known, since the frequency of the image signal is equal to the difference between double the local oscillation frequency and the R-F signal frequency, the band elimination filter 20 for blocking the image signal comprises an open-ended line having a length corresponding to ½ the wavelength of the differential frequency between double the local oscillation signal frequency and the R-F signal frequency.

With this arrangement, the high frequency signal received at the terminal 1 is applied to the diode 7 in an efficient manner since the input stage of the local oscillation signal exhibits an open impedance as viewed from the diode 7 because of the band elimination filter 18, and the local oscillation signal received at the terminal 2 is also applied to the diode 7 in an efficient manner because of the band elimination filter 17. The image signal produced at the diode 7 is suppressed because the input thereof is shortcircuited by the band elimination filter 20 and the output thereof is shortcircuited by the low pass filter 12. The intermediate frequency signal produced at the diode 7 is transmitted to the output terminal 3 through the low pass filter 12 in an efficient manner because the input thereof is short-circuited by the intermediate frequency signal shorting line 13.

Thus, since the high frequency signal input line 15 does not include a multi-stage band pass filter, the loss is low. Furthermore, since the image signal produced at the diode 7 is suppressed by the short-circuit, the efficiency of the generation of the intermediate frequency signal is enhanced and the performance of the mixer circuit is considerably enhanced. Furthermore, the circuit construction is simplified, the adjustment is easy and a size reduction is attained.

Figure 5:
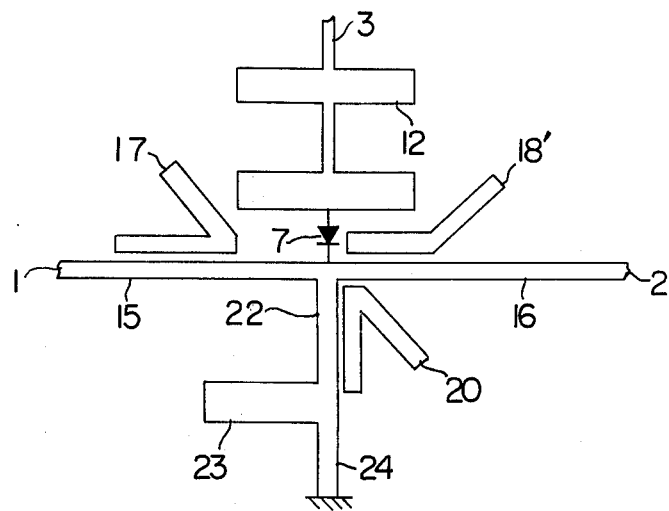

FIG. 5 shows a modification of the pattern shown in FIG. 4. Since it is sufficient that the high frequency signal band elimination filter 18 of FIG. 4 is inserted in such a manner that it exhibited an open impedance to the high frequency signal as viewed from the diode 7, the same effect is obtained in the embodiment of FIG. 5 where a high frequency signal band elimination filter 18' is inserted as illustrated. The same is true for the local oscillation signal band elimination filter 17. Furthermore, since it is sufficient that the intermediate frequency signal shorting line 13 of FIG. 4 exhibits a substantially open impedance to the high frequency signal and the local oscillation signal and a shorted impedance to the intermediate frequency signal, the embodiment of FIG. 5 employs an arrangement in which an open-ended line 23 and a short-ended line 24 of the length substantially equal to one quarter of the wavelengths of the high frequency signal and the local oscillation signal are connected to one end of a line 22 of a length substantially equal to the wavelengths of the above signals. In this case, the lines 22 and 23 serve to exhibit a substantially open impedance to the above two signals and the lines 22 and 24 serve to exhibit a shorted impedance to the intermediate frequency signal. Thus, it is sufficient that the intermediate frequency signal shorting line exhibits a substantially open impedance to the high frequency signal and the local oscillation signal while it exhibits a shorted impedance to the intermediate frequency signal, and hence the present invention need not be limited to the patterns of FIGS. 4 and 5.

Figure 6:
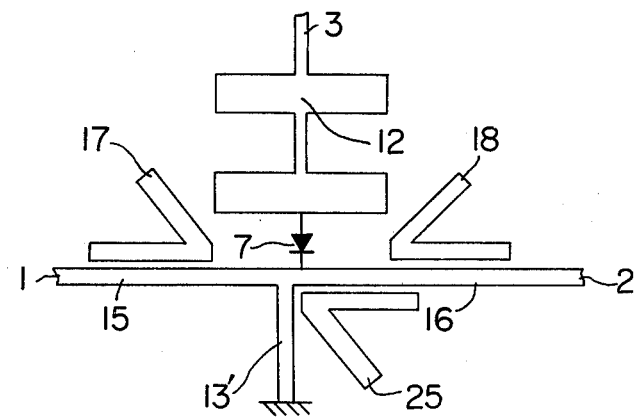

FIG. 6 shows a pattern of another embodiment of the present invention which slightly differs from the embodiment of FIG. 4 in the arrangement of the parallel-coupled band elimination filter for the image signal.

In the present embodiment, a parallel-coupled band elimination filter 25 is coupled to the high frequency signal input line 15 or the local oscillation signal input line 16 in such a manner that the center of the half wavelength line of the band elimination filter 25 is located close to the diode 7. To this end, a line 13' which exhibits an open impedance to the high frequency signal and the local oscillation signal and a shorted impedance to the intermediate frequency signal is located a small distance apart from the junction point of the diode 7. With this arrangement, the input line exhibits a substantially shorted impedance to the image signal frequency as viewed from the diode 7. Accordingly, the image signal produced at the diode 7 is suppressed because the input thereof is shortcircuited to the image signal frequency by the image signal parallel-coupled band elimination filter 25 and the stage following the diode 7 is also shortcircuited by the low pass filter 12. Thus, the efficiency of the generation of the intermediate frequency can be enhanced.

Figure 7:
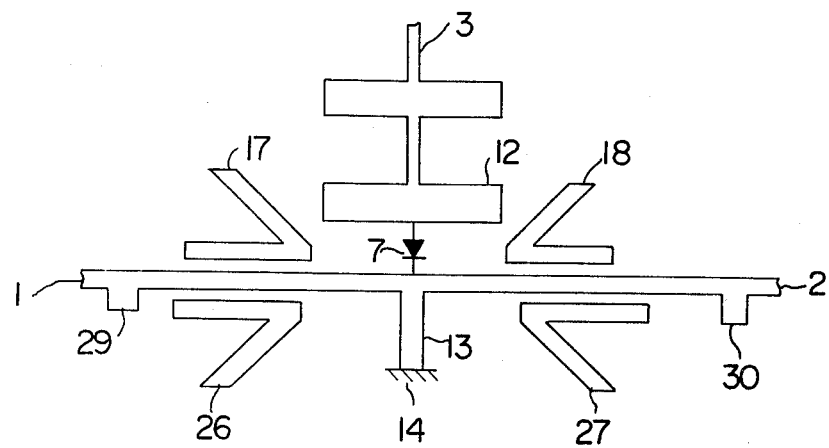

FIG. 7 shows a pattern of another embodiment of the present invention, which differs from the previous embodiment in the arrangement of the image signal band elimination filter. Coupled to the high frequency signal input line on the opposite side of the local oscillation signal blocking parallel-coupled filter 17 is an image signal blocking parallel-coupled filter 26 at a point spaced by one quarter of the wavelength of the image signal from the junction point of the diode 7. That portion of the parallel-coupled filter 26 which forms a band elimination filter is arranged on a line extended from the line leading to the diode 7 as shown in FIG. 7. Similarly, coupled to the local oscillation signal input line on the opposite side of the high frequency signal blocking parallel-coupled filter 18 is an image signal blocking parallel-coupled filter 27. In the embodiment of FIG. 7, the frequency of the local oscillation signal is selected to be lower than the frequency of the high frequency signal. It should be readily understood that when the relation of the frequencies is oppositely selected, the relation of the distances from the junction point of the diode to the respective parallel-coupled filters should be inverted.

The low pass filter 12 from which the intermediate frequency signal is taken, the output terminal 3 and the intermediate frequency shorting circuits 13 and 14 are identical to those used in the prior art circuit shown in FIG. 1.

Matching stubs 29 and 30 are connected to the respective input lines to cancel the impedances to the respective input signal frequencies, of the parallel-coupled filters coupled to the respective input lines. The high frequency signal received at the terminal 1 is applied to the diode 7 in an efficient manner because the impedances of the parallel-coupled filters 17 and 26 are cancelled by the stub 29 and the circuit of the terminal 2 assumes an open impedance as viewed from the junction point of the diode 7 which is spaced by one quarter of the wavelength since the high frequency signal parallel-coupled filter 18 exhibits a shorted impedance to the high frequency signal. Similarly, the local oscillation signal received at the terminal 2 is applied to the diode 7 in an efficient manner because the impedances of the parallel-coupled filters 18 and 27 are cancelled by the stub 30 and the circuit of the terminal 1 exhibits the open impedance by the local oscillation signal parallel-coupled filter 17. In this case, since the short-ended stub 13 assumes the open impedance to the two input signals and the image signal, it acts as if it were not inserted.

Harmonics of those two input signals are produced at the diode 7, of which the intermediate frequency signal and the image signal have large powers. The image signal, however, is suppressed because the stage following to the diode 7 is short-circuited by the low pass filter 12 and the input thereof assumes the open impedance by the image signal parallel-coupled filters 26 and 27. As a result, the generation of the intermediate frequency signal is enhanced. The intermediate frequency signal is transmitted to the output terminal 3 in an efficient manner because the input is shortcircuited by the short-ended stub 3.

Figure 8:
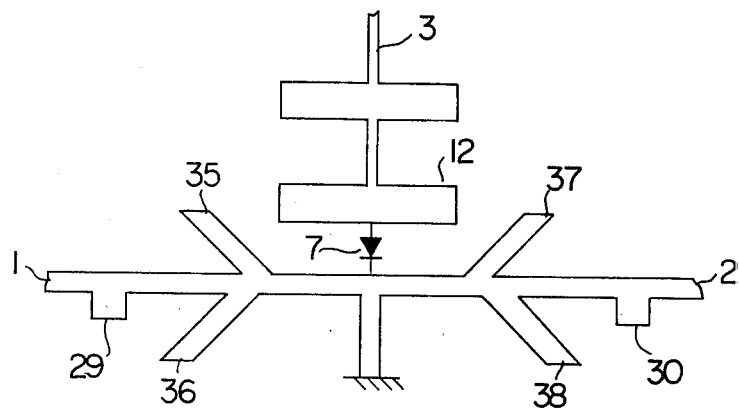

FIG. 8 shows a pattern of a further embodiment of the mixer circuit of the present invention. The terminals 1 and 2 are high frequency signal input terminal and local oscillation signal input terminal, respectively. At a middle point of a line extending between the input terminals 1 and 2, the diode 7 is connected in parallel with the line. Connected to the high frequency signal input line is an open-ended stub 35 of a length equal to one quarter of the wavelength of the local oscillation signal, at a point spaced from the junction point of the diode 7 by a distance equal to one quarter of the wavelength of the local oscillation signal. Also connected to the high frequency signal input line is an open-ended stub 36 of a length equal to one quarter of the wavelength of the image signal at a point spaced from the junction point of the diode 7 by a distance equal to one quarter of the wavelength of the image signal. Similarly, connected to the local oscillation signal input line is an open-ended stub 37 of a length equal to one quarter of the wavelength of the high frequency signal at a point spaced from the junction point of the diode 7 by a distance equal to one quarter of the wavelength of the high frequency signal, and also connected to the local oscillation signal input line is an open-ended stub 38 of a length equal to one quarter wavelength of the image signal at a point spaced from the junction point of the diode 7 by a distance equal to one quarter of the wavelength of the image signal. The low pass filter 12 from which the intermediate frequency signal is taken, the output terminal 3 and the diode current conduction circuits 13 and 14 are identical to those shown in FIG. 7.

Matching stubs 29 and 30 are connected to the respective input lines to provide matching to the respective input signals. The high frequency signal received at the terminal 1 is transmitted to the load diode 7 in a manner as if the stubs 35, 36 and 37 were not inserted because the impedances of the stubs 35 and 36 are cancelled by the stub 29. Namely, the impedance as viewed from the junction point of the diode 7 into the terminal 2 appears as a shorted impedance because the stub 37 resonates to the high frequency signal and hence the junction point of the diode 7 which is spaced by one quarter of the wavelength from the stub 37 appears as an open impedance so that the high frequency signal received at the terminal 1 is transmitted to the diode 7 in an efficient manner. Similarly, the local oscillation signal received at the terminal 2 is transmitted to the diode 7 in an efficient manner because the impedances of the stubs 37 and 38 are cancelled by the matching stub 30 and the stub 35 serves to provide an open impedance at the terminal 1.

Harmonics of the two input signals are generated at the diode 7, of which the intermediate frequency signal and the image signal have large powers. The intermediate signal is transmitted to the output terminal 3 through the low pass filter 12 in an efficient manner because the input circuit is short-circuited by the short-ended stub 13. The image signal, however, is suppressed because the stage following to the diode is shortcircuited by the low pass filter 12 and the input circuit exhibits the open impedance by the stubs 36 and 38. As a result, the efficiency of the generation of the intermediate frequency signal is enhanced and the performance of the mixer circuit is enhanced.

As described above, instead of using a multi-stage band pass filter having a sharp characteristic, the present embodiment uses the band elimination filters to the signal to be suppressed. Accordingly, a mixer of a simple construction can be provided.

What is claimed is:

1. A mixer circuit arrangement of a high frequency plane circuit employing a microwave strip line as a basic component wherein a diode is connected in parallel with said line and a high frequency signal and a local oscillation signal being applied at opposite ends of said line toward said diode, comprising:

a first filter including a double-open-ended line of a length equal to one half of the wavelength of said local oscillation signal with a portion thereof having a length equal to one quarter of said wavelength from one end of said line being arranged adjacent to said transmission line, said first filter being coupled to the high frequency signal input line at such a point that the impedance thereof as viewed from the junction point of said diode assumes an open impedance at the resonant frequency of said first filter;

a second filter including a double-open-ended line of a length equal to one half of the wavelength of said high frequency signal and constructed in the same manner as said first filter, said second filter being coupled to the local oscillation signal input line at such a point that the impedance thereof as viewed from said junction point of said diode assumes an open impedance to the resonant frequency of said second filter;

a line conected to said junction point of said diode on the opposite side to said diode and exhibiting a substantially shorted impedance to the frequency of an intermediate frequency signal which is a frequency component equal to the frequency difference between said high frequency signal and said local oscillation signal; and a third filter including a double-open-ended line of a length equal to one half of the wavelength of an image signal having a frequency equal to the difference between twice the frequency of said local oscillation signal and the frequency of said high frequency signal and having the same construction as said first filter, said third filter being coupled to said line connected to said junction point, at such point that the impedance thereof as viewed from said junction point of said diode assumes a shorted impedance to the frequency of said image signal; and a line connected to the other end of said diode to take out said intermediate signal produced at said diode.

2. A mixer circuit arrangement of a high frequency plane circuit employing a microwave strip line as a basic component wherein a diode is connected in parallel with said line with a high frequency signal and a local oscillation signal being applied to opposite ends of said line toward said diode, comprising:

a first filter including a double-open-ended line of a length equal to one half of the wavelength of said local oscillation signal with a portion thereof having a length equal to one quarter of said wavelength from one end of said line being arranged adjacent to said transmission line, said first filter being coupled to the high frequency signal input line at such a point that the impedance thereof as viewed from the junction point of said diode assumes an open impedance at the resonant frequency of said first filter;

a second filter including a double-open-ended line of a length equal to one half of the wavelength of said high frequency signal and constructed in the same manner as said first filter, said second filter being coupled to the local oscillation signal input line at such a point that the impedance thereof as viewed from said junction point of said diode assumes an open impedance to the resonant frequency of said second filter;

a line connected to said high frequency signal input line or said local oscillation signal input line and exhibiting a shorted impedance to the frequency of an intermediate frequency signal having a frequency equal to the difference between the frequency of said high frequency signal and the frequency of said local oscillation signal; and an output line connected to the other end of said diode for taking out said intermediate frequency signal.

3. A mixer circuit arrangement employing a distributed constant circuit using a microwave strip line comprising:

a line connecting a high frequency signal input terminal and a local oscillation signal input terminal;

a frequency converting diode having one end thereof connected to an intermediate point of said line;

a low pass filter of a distributed constant circuit configuration having the other end of said diode connected thereto and passing an intermediate frequency signal therethrough;

first band stop means coupled to said line on the side of said high frequency signal input terminal for selectively blocking only a local oscillation signal;

second band stop means coupled to said line on the side of said local oscillation signal input terminal for selectively blocking only a high frequency signal; and third means arranged adjacent to the point on said line to which said one end of said diode is connected and exhibiting an open impedance to said high frequency signal and said local oscillation signal while grounding said intermediate frequency signal, wherein said third means includes a line connected to said intermediate point on the opposite side thereof to said diode and exhibiting a substantially shorted impedance to said intermediate frequency signal, and a second filter in the form of double-open-ended line of a length equal to one-half of the wavelength of an image signal having a frequency equal to the difference between twice the frequency of said local oscillation signal and the frequency of said high frequency signal, said second filter being coupled to said line connected to said intermediate point at such a point that the impedance thereof as viewed from said intermediate point assumes a short circuited impedance to the frequency of said image signal.

* * * * *